US010928434B2

(12) United States Patent
Marvin et al.

(10) Patent No.: US 10,928,434 B2
(45) Date of Patent: Feb. 23, 2021

(54) AVERAGED REFERENCE WITH FAULT MONITORING

(71) Applicant: Analog Devices International Unlimited Company, Limerick (IE)

(72) Inventors: Jeffrey David Marvin, Williston, VT (US); Benjamin Thomas Voegeli, South Burlington, VT (US); Gregg Romeo Castellucci, Plattsburgh, NY (US); Andrew Bishop, Essex, VT (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/275,124

(22) Filed: Feb. 13, 2019

(65) Prior Publication Data

US 2019/0257871 A1 Aug. 22, 2019

Related U.S. Application Data

(60) Provisional application No. 62/633,500, filed on Feb. 21, 2018.

(51) Int. Cl.
*G01R 31/00* (2006.01)

(52) U.S. Cl.
CPC .................. *G01R 31/006* (2013.01)

(58) Field of Classification Search
CPC .............. G01R 31/006; G01R 31/2827; G01R 19/16528; G05B 23/0235; G05B 23/0221
See application file for complete search history.

(56) References Cited

U.S. PATENT DOCUMENTS

| 6,147,521 A | 11/2000 | Degoirat et al. |
| 9,233,763 B1 * | 1/2016 | Chen ................... G05B 23/0235 |

(Continued)

FOREIGN PATENT DOCUMENTS

| CN | 110174882 | 8/2019 |
| DE | 102019001232 | 8/2019 |

(Continued)

OTHER PUBLICATIONS

"Japanese Application Serial No. 2019-029128, Notification of Reasons for Refusal dated Dec. 11, 2019", w/ English Translation, 12 pgs.

(Continued)

*Primary Examiner* — Dominic E Hawkins
(74) *Attorney, Agent, or Firm* — Schwegman Lundberg & Woessner, P.A.

(57) ABSTRACT

The subject disclosure describes a structure and method that generates the average of two or more reference quantities (e.g., reference voltage potentials) and monitors the integrity of the voltage reference potentials. The subject technology produces a reference with improved accuracy and more accurate monitoring compared to traditional techniques. For example, the subject technology provides for a fault circuit that includes a monitoring circuit, and an averaging circuit configured to receive a plurality of reference signals and to produce an averaged reference signal based on the received plurality of reference signals. In some examples, the monitoring circuit is configured to receive the averaged reference signal from the averaging circuit, compare the averaged reference signal to each of the plurality of reference signals, and generate a fault signal when the averaged reference signal deviates from at least one of the plurality of reference signals by at least a threshold value.

20 Claims, 4 Drawing Sheets

(56) References Cited

U.S. PATENT DOCUMENTS

| | | | |
|---|---|---|---|
| 2006/0043911 A1* | 3/2006 | Shao | H05B 45/10 |
| | | | 315/291 |
| 2007/0069875 A1* | 3/2007 | Doi | G06F 21/554 |
| | | | 340/440 |
| 2008/0166050 A1* | 7/2008 | Yeh | G06K 9/00805 |
| | | | 382/190 |
| 2010/0253512 A1* | 10/2010 | Wagner | G05B 23/0229 |
| | | | 340/540 |
| 2015/0077089 A1 | 3/2015 | Miyazawa | |
| 2016/0240258 A1* | 8/2016 | Yamaha | G11C 16/0408 |

FOREIGN PATENT DOCUMENTS

| | | |
|---|---|---|
| JP | H04253298 | 9/1992 |
| JP | H07200081 | 8/1995 |
| JP | 2015055598 | 3/2015 |
| JP | 2016114496 | 6/2016 |
| JP | 6700449 B2 | 5/2020 |

OTHER PUBLICATIONS

"Japanese Application Serial No. 2019-029128, Response filed Mar. 11, 2020 to Notification of Reasons for Refusal dated Dec. 11, 2019", w/ English Claims, 10 pgs.

\* cited by examiner

AVERAGED REFERENCE WITH FAULT MONITORING

CROSS-REFERENCE TO RELATED APPLICATIONS

This application claims the benefit of priority under 35 U.S.C. § 119 from U.S. Provisional Patent Application 62/633,500, entitled "AVERAGED REFERENCE WITH FAULT MONITORING," filed Feb. 21, 2018, which is incorporated herein by reference in its entirety.

FIELD OF THE DISCLOSURE

The present description relates generally to electrical circuits, and more particularly, to averaged reference with fault monitoring.

BACKGROUND

There is a growing interest in functional safety in electronics, driven in part by trends in automotive development including self-driving vehicles and Advanced Driver Assistance Systems (ADAS). The emphasis on safety is driving development of circuit techniques to supervise the health of a system and indicate potential failures. In an example, electronic circuits can be used to control the power, braking, steering, or other systems of a vehicle. These electronic circuits can rely on reference signals as a source of truth, such as to determine whether these circuits, or the systems controlled by these circuits, are functioning properly. Verifying the accuracy or integrity of such references, so as to improve the safety of the systems in which they are deployed, can require the use of additional circuits and references. These additional circuits and references can add uncertainty to a system which can decrease the overall safety and reliability of the system.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The subject disclosure provides for a fault monitoring circuit that generates an average or other central tendency of two or more reference quantities (e.g., reference voltage potentials) and monitors the integrity of the averaged reference. The subject technology produces an averaged reference potential with improved accuracy and more accurate monitoring compared to traditional solutions. For example, the two voltage reference potentials are averaged with each other, and are checked with each other. The result is that the tolerances do not stack on top of each other in the same manner as might occur in other approaches. Instead, the tolerances may overlap with each other in a manner that provides an aggregate tolerance that is improved as compared to a worst-case example where the respective worst-case tolerance values are added arithmetically.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more examples. In one or more instances, structures and components are shown in block diagram form in order to avoid obscuring the concepts of the subject technology.

Figure 1:
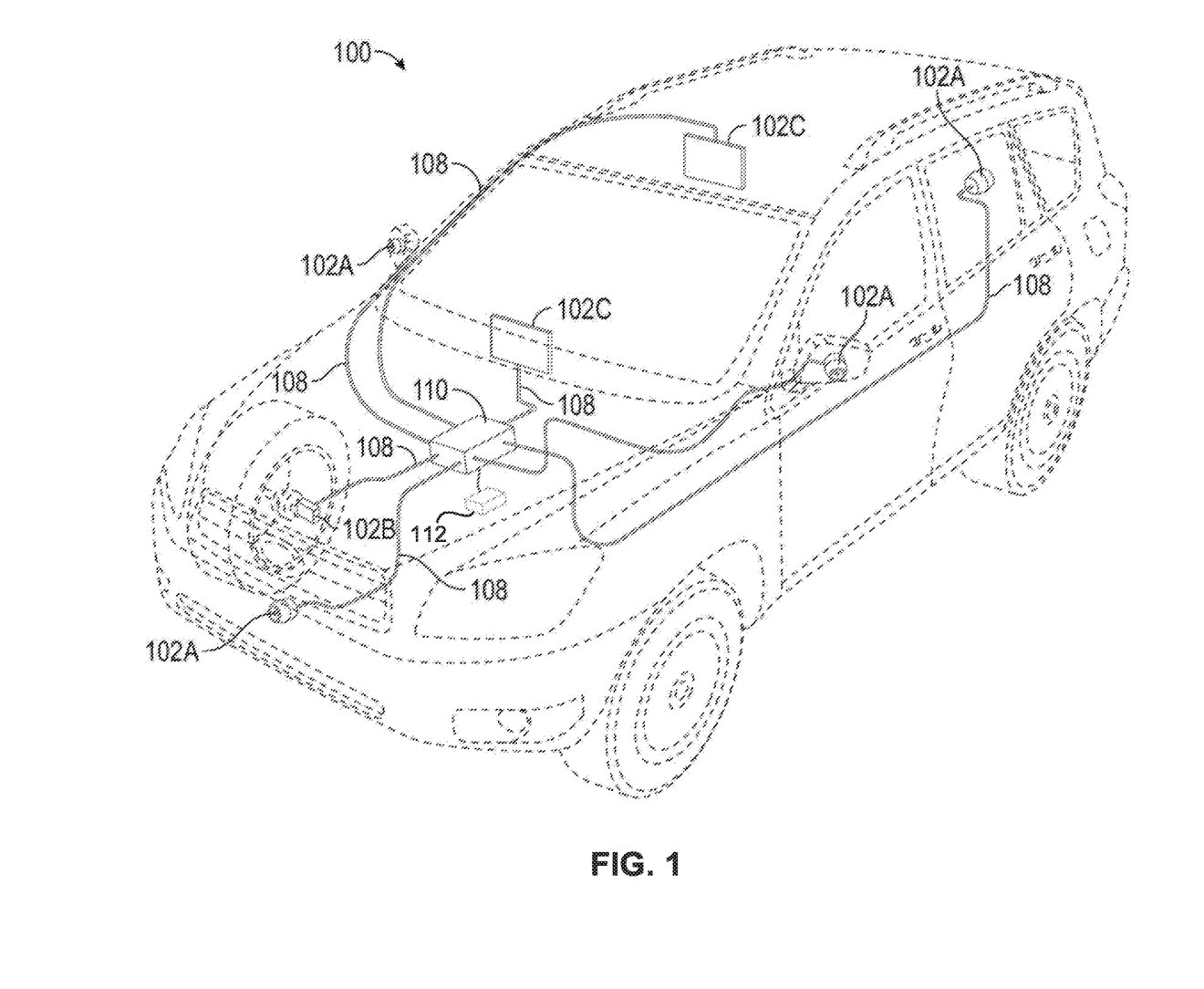
FIG. 1 illustrates an example network environment in which averaged reference fault monitoring may be implemented in accordance with one or more examples.

FIG. 1 illustrates an example network environment 100 in which averaged reference fault monitoring may be implemented in accordance with one or more examples. Not all of the depicted components may be required, however, and one or more examples may include additional components not shown in the figure. Variations in the arrangement and type of the components may be made without departing from the scope of the claims as set forth herein. Additional components, different components, or fewer components may be provided.

The example network environment 100 includes a number of electronic devices 102A-C that are coupled to an electronic device 110 via the transmission lines 108. The electronic device 110 may communicably couple the electronic devices 102A-C to one another. In one or more examples, one or more of the electronic devices 102A-C are communicatively coupled directly to one another, such as without the support of the electronic device 110. The example network environment 100 also includes an electronic device 112 coupled to the electronic device 110. In this example, the electronic device 110 can communicably couple the electronic device 112 to the electronic devices 102A-C. In one or more examples, the electronic device 112 is part of the electronic device 110

Figure 3A:
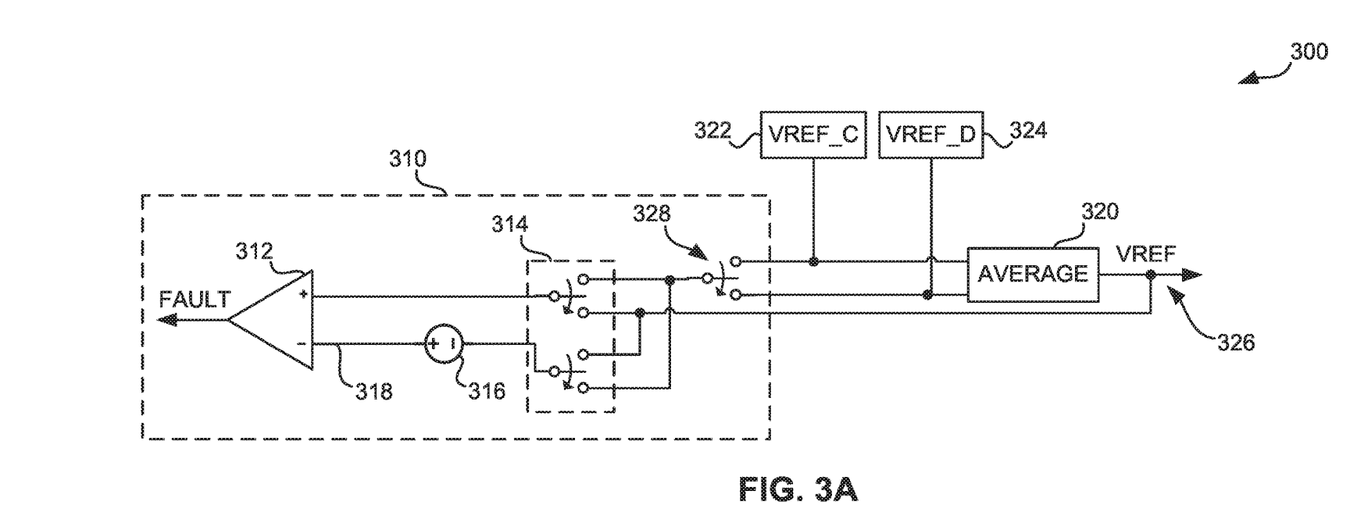
FIG. 3A illustrates a schematic diagram of an example of a fault monitoring circuit with averaged reference voltage potentials in accordance with one or more examples.

In one or more examples, one or more of the transmission lines 108 are wired communication transmission lines, such as Ethernet, fiber optic, coaxial, or the like. The electronic device 110 may be, or may include, a switch device, a routing device, a hub device, or generally any device that may communicably couple the electronic devices 102A-C. Any of the electronic devices 102A-C may include, or may be, the fault monitoring circuit 300 of FIG. 3 or may implement the process 400 of FIG. 4.

In one or more examples, at least a portion of the example network environment 100 is implemented within a vehicle, such as a passenger car. For example, the electronic devices 102A-C may include, or may be coupled to, various systems within a vehicle, such as a powertrain system, a chassis system, a telematics system, an entertainment system, a camera system, a sensor system, such as a lane departure system, a diagnostics system, or generally any system that may be used in a vehicle. In FIG. 1, the electronic devices 102A are depicted as camera devices, such as forward-view, rear-view and side-view cameras; the electronic device 102B is depicted as a sensor, such as a local diagnostics system; the electronic devices 102C are depicted as entertainment systems; and the electronic device 112 is depicted as a central on-board diagnostics system. In one or more examples, the electronic device 110 and/or one or more of the electronic devices 102A-C may be communicatively coupled to a public communication network, such as the Internet.

In some examples, the electronic device 110 includes functional safety technology, such as fault monitoring of one or more voltage reference potentials. For example, if electronics are connected to the brakes or the steering of a passenger car, it is very important that there be redundancy in the electrical system. In integrated circuits, fundamentally, every circuit has potentially a point of failure, where a reference can be used as a source of truth in the circuit. In this respect, there is a desire to check the integrity of every single circuit in the system. An approach includes applying circuitry that generates a reference quantity (e.g., voltage reference potential); however, checking that the reference potential is accurate is a problem, because it requires another reference to check the main reference and there needs to be a window applied around the check that allows for tolerances. When the integrity of the main reference is checked using another reference, the tolerances of these two voltage reference potentials stack on top of each other unfavorably. The result is that the main reference becomes effectively less accurate.

Figure 2A:
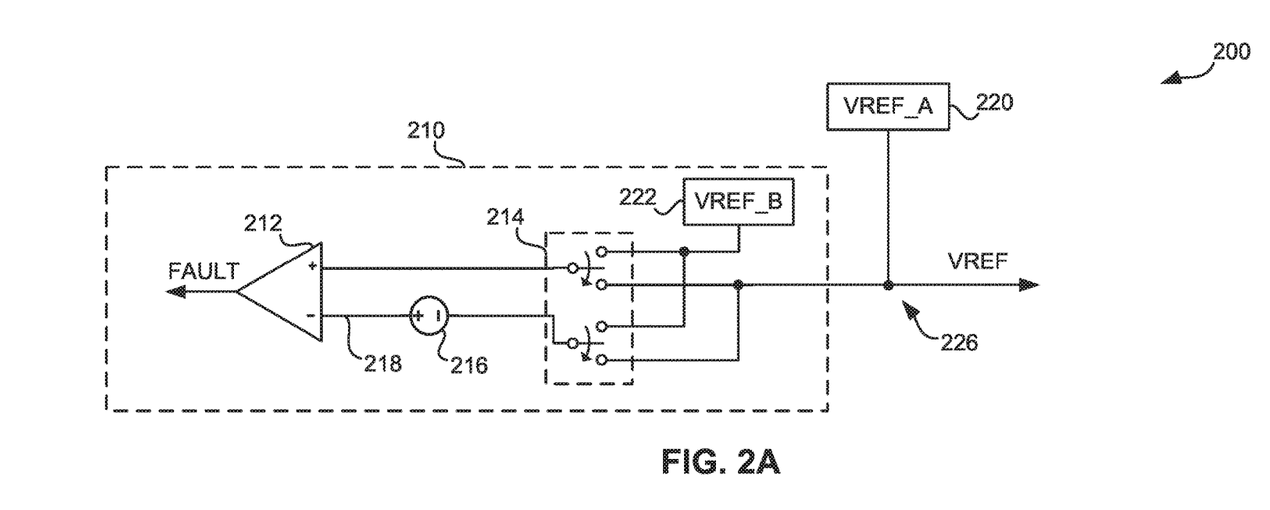
FIG. 2A illustrates a schematic diagram of an example of a traditional fault monitoring circuit that monitors two individual reference voltage potentials in accordance with one or more examples.

FIG. 2A illustrates a schematic diagram of an example of a fault monitoring circuit 200 that monitors two individual reference voltage potentials. The fault monitoring circuit 200 includes a monitoring circuit 210. The monitoring circuit 210 includes a comparator 212, a switch 214, and an error check circuit 216. In some examples, the error check circuit 216 includes a resistor that is series connected to one of the inputs to the comparator 212 and one of the outputs of the switch 214. In some examples, the electronic device 110 is, or includes a portion of, the fault monitoring circuit 200.

The comparator 212 can compare a secondary voltage reference 222 against a primary voltage reference 220. In some examples, the comparator 212 can be a window comparator, where the comparator 212 compares one of the reference voltages with an added offset relative to a first fault threshold that is greater than a nominal reference value and to a second fault threshold that is smaller than the nominal reference value. In operation, a fault signal can be generated from the comparator 212. Such a fault signal can have a high signal (e.g., a voltage that is at least as large as an indicated high-threshold voltage) value to indicate that a fault has occurred or a low signal value (e.g., a voltage that is at least as small as an indicated low-threshold voltage) that indicates no fault has occurred.

In some examples, the inputs to the comparator 212 can be swapped such that the comparator 212 can check the integrity of each of the two voltage references relative to the other. The error check circuit 216 can apply an additional value (e.g., an offset signal or value) to a voltage or signal received from one of the two voltage references. This additional value can be a voltage, a current, a phase, or a frequency, depending on the unit example of the two voltage references. In this respect, the two voltage references can be checked against each other to ensure the voltage generated by the two voltage references are within an indicated threshold range or value of each other. The indicated threshold range or value be a current or a voltage, based on the examples of the voltage references. The indicated threshold value can be defined or set by the error check circuit 216. The error check circuit 216 can produce an error check signal that can be applied to an incoming signal from a second output of the switch 214 to produce a combined voltage signal 218. For example, the error check signal (e.g., VCHECK) can be set to 20 mV. In this respect, if the primary voltage reference 220 is within 20 mV (e.g., a threshold range) of the secondary voltage reference 222, a fault condition does not occur. The fault signal can go high, such as to indicate a fault, when the primary voltage reference falls or rises outside of the 20 mV range.

In some examples, the fault monitoring circuit 200 can include at least two comparators (not shown). A first comparator can be used to determine whether an incoming signal rises above an indicated threshold range. A second comparator can be used to determine whether the incoming signal falls below an indicated threshold range. As shown in FIG. 2A, a single comparator 212 can be driven by the switch 214. The switch 214 can switch between the two voltage references, such as to alternatively apply the offset signal to the primary voltage reference 220 or the secondary voltage reference 222. In some examples the offset signal (e.g., the magnitude of the offset) can be adjusted by the error check circuit 216 to cause the monitoring circuit 210 to detect whether the incoming signals rise above or below the indicated threshold range.

In some examples, if the error check circuit 216 applies a 20 mV offset (e.g., 2% of 2V) to the voltage reference being checked, then the resistor connected in series with an input of the comparator can be a 1 kiloohm (K-Ohm) resistor. The 1K-Ohm resistor can cause a 20 uA to flow through the series circuit, such as to generate a 20 mV drop across the resistor. The voltage level of the error check signal (e.g., $V_{CHECK}$) can a be safe limit that corresponds to the tolerance of the two voltage reference potentials relative to each other. Such tolerance can indicate the maximum amount of deviation a system can safely tolerate between the two voltage references.

In some examples, the integrity of a voltage reference can be checked by comparing a primary voltage reference 220 with a secondary voltage reference 222. If the voltage references differ by more than a threshold voltage (e.g., VCHECK), a fault can be declared. Such faults can be used to put the system into a safe state (e.g., a system can be shut down, an auxiliary reference can be enabled, etc.). However, the error or tolerance (e.g., statistical error) of each voltage reference can be independent. Using one voltage reference to check the integrity of another voltage reference counts these errors multiple times. This can result in the detection or reporting of false faults.

To avoid the detection of false faults, a monitoring circuit 210 can include a comparator window (e.g., VCHECK) that is large enough to include normal or nominal operating voltage range of the circuit. In some examples, the comparator window can be wide enough to account for errors in components of the monitoring circuit 210, such as comparator error and the combined tolerance of the primary voltage reference 220 and the secondary voltage reference 222. These errors, however, can be small enough to be ignored. The monitoring circuit 210 can also include check limit tolerance (e.g., $V_{LIMIT}$) to find or account for limits of the primary voltage reference (e.g., VREF 226) value that could occur before a fault is declared.

Figure 2B:
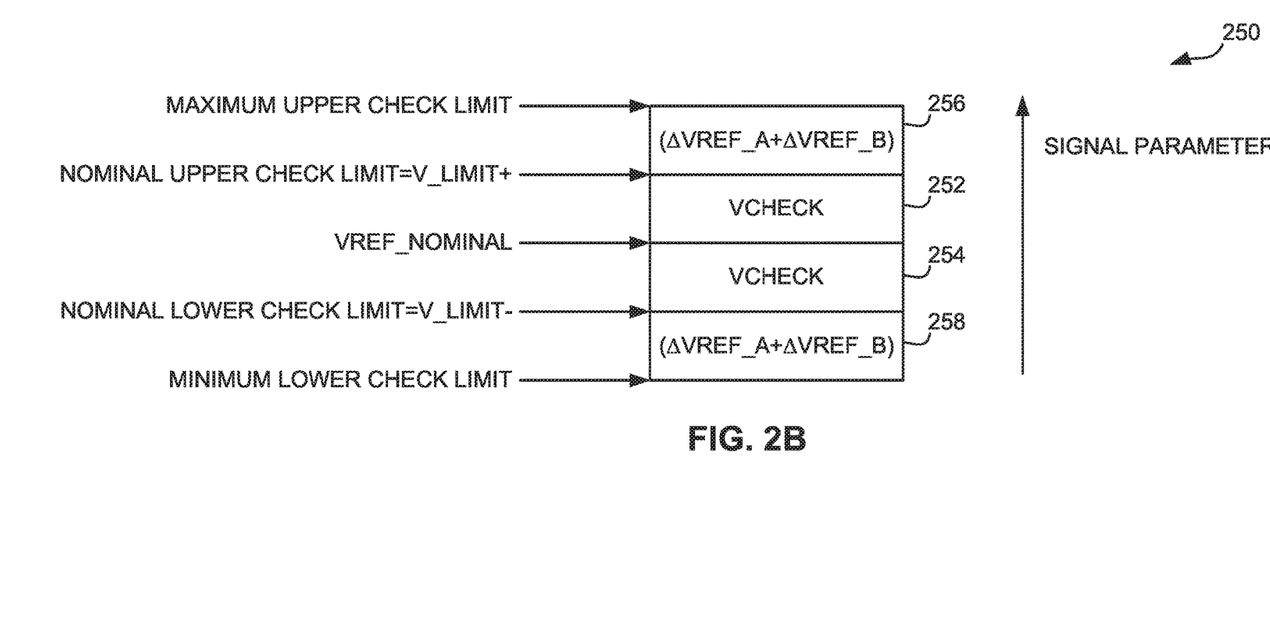
FIG. 2B illustrates a conceptual diagram of an example of an error voltage range for the traditional fault monitoring circuit of FIG. 2A in accordance with one or more examples.

FIG. 2B illustrates a conceptual diagram of an example of an error budget 250 for the fault monitoring circuit 200, as shown in FIG. 2A. In some examples, the vertical height of the boxed elements represents the magnitude if a signal parameter being monitored. Such signal parameters can include a voltage, current, phase, a frequency, or any other measurable signal attribute. The label inside the boxed elements represents a quantity or budget parameter.

The error budget 250 shown in FIG. 2B can indicate the range in which a monitored signal (e.g., a monitored signal parameter) can vary during normal or nominal operation of a circuit that uses the monitored signal. As shown in FIG. 2B, $\Delta$VREF_A is the variation of the primary voltage reference, and $\Delta$VREF_B is the variation of the second voltage reference. In some scenarios, $\Delta$VREF_A and $\Delta$VREF_B can drift apart in opposite directions (e.g., $\Delta$VREF_A can increase from its nominal value by 0.5% while $\Delta$VREF_B decreases from its nominal value by 0.5%). Ignoring errors in other components or signals of the monitoring circuit 210, if $\Delta$VREF_A and $\Delta$VREF_B are each 2% of the nominal values of their respective voltage reference, the primary voltage reference (VREF_A) variation check can be set to +/−2%, while the secondary voltage reference (VREF_B) variation check can be set to +/−2%. In this scenario, the voltage variation limit (e.g., Nominal Upper Check limit) must be far enough away from the nominal value of a monitored reference signal (e.g., VREF-NOM) to prevent false fault declarations by the monitoring circuit 210. This can require that the check limit set point (e.g., VCHECK 252 or 254) be larger than the worst-case maximum difference between VREF_A and VREF_B. As shown in 256 and 258, this condition is satisfied when VCHECK is larger than the maximum of variation in difference between $\Delta$VREF_A and $\Delta$VREF_B.

FIG. 3A illustrates a schematic diagram of an example of a fault monitoring circuit 300 that monitors the average of two or more reference voltage potentials. Not all of the depicted components may be used, however, and one or more examples may include additional components not shown in the figure. Variations in the arrangement and type of the components may be made without departing from the spirit or scope of the claims as set forth herein. Additional components, different components, or fewer components may be provided.

The fault monitoring circuit 300 includes a monitoring circuit 310 and an averaging circuit 320. In some examples, the electronic device 110 is, or includes a portion of, the fault monitoring circuit 300. The monitoring circuit 310 includes a comparator 312, a switch 314, and an error check circuit 316. In some examples, the error check circuit 316 includes an operational amplifier and a resistor to create a ratio of the averaged reference voltage 326. In other examples, the error check circuit 316 includes a resistor that is series connected to one of the inputs to the comparator 312 and one of the outputs of the switch 314.

The averaging circuit 320 includes a voltage divider formed with resistors (e.g., a resistor network), where each signal path from the reference to the comparator 312 includes a series-connected resistor. In some examples, an intermediate node between the series-connected resistive elements is coupled to an input to the monitoring circuit 310 to supply the averaged reference signal. In particular, the intermediate node is directly coupled to a second input to the switch 314. The resistors may be matched to a same value in some examples, or may be mismatched in other examples. In operation, the averaging circuit 320 receives multiple voltage reference (e.g., 322, 324) signals and produces an averaged reference voltage 326 based on the received voltage reference signals. In some examples, the averaging circuit 320 averages the voltage reference signals simultaneously, and the comparator 312 compares the averaged reference voltage 326 to one of the voltage reference signals. In some examples, the averaging and monitoring technique of the fault monitoring circuit 300 can be applied to other quantities used in electronic circuits, such as current, phase, or frequency. In some examples the averaging circuit 320 can be any circuit that performs operations using the reference signals to generate a combined signal having a variation that is smaller than a total variation of the reference signals.

There are four different configurations of the fault monitoring circuit 300 during operation. In a first configuration, the switches 314 and 328 (hereinafter, "the switch 328") couples the voltage reference 322 (e.g., VREF_C) to the non-inverting input of the comparator 312 and couples the averaged reference voltage 326 (e.g., a combined reference signal) with the error compensation signal 318 to the inverting input of the comparator 312. The comparator 312 can output a logical high signal indicating that a fault condition exists when the voltage reference 322 exceeds the voltage sum of the averaged reference voltage 326 and the error compensation signal 318.

In a second configuration, the switch 314 couples the averaged reference voltage 326 to the non-Inverting input of the comparator 312 and couples the voltage reference 322 with the error compensation signal 318 to the inverting input of the comparator 312. The comparator 312 can output a logical high signal indicating that a fault condition exists when the averaged reference voltage 326 exceeds the voltage sum of the voltage reference 322 and the error compensation signal 318.

In a third configuration, the switch 314 couples the voltage reference 324 VREF_D) to the non-inverting input of the comparator 312 and couples the averaged reference voltage 326 with the error compensation signal 318 to the inverting input of the comparator 312. The comparator 312 outputs a logical high signal indicating that a fault condition exists when the voltage reference 324 exceeds the voltage sum of the averaged reference voltage 326 and the error compensation signal 318.

In a fourth configuration, the switch 314 couples the averaged reference voltage 326 to the non-inverting input of the comparator 312 and couples the voltage reference 324 with the error compensation signal 318 to the inverting input of the comparator 312. The comparator 312 outputs a logical high signal indicating that a fault condition exists when the averaged reference voltage 326 exceeds the voltage sum of the voltage reference 324 and the error compensation signal 318.

In some examples, the switch 314 includes a control circuit or other digital circuitry to run a state machine that controls a toggle operation between the voltage reference 322 and the voltage reference 324. The state machine may include additional states depending on the number of voltage reference potentials being averaged and checked. In operation, the switch 314 selects the voltage reference 322 and provides a connection to the comparator 312 to compare the averaged reference voltage 326 to the voltage reference 322 during a first state of the state machine. In some examples, the state machine then transitions into a second state, where the switch 314 may select the voltage reference signal 324 and provides a connection to the comparator 312 to compare the averaged reference voltage 326 to the voltage reference 324. In some examples, the comparator 312 issues a fault signal after at least one of the voltage reference signals has been compared to the averaged reference voltage 326. In other examples, the comparator 312 issues the fault signal after all of the voltage reference signals have been compared to the averaged reference voltage 326. In some examples, the averaging circuit 320 fans out the averaging voltage signal to individual signal paths based on the number of voltage reference potentials such that individual connections between each of the reference voltage potentials and corresponding fanned out average voltage signal are formed to simultaneously average and compare the reference voltage potentials.

In some examples, the monitoring circuit 310 logs the comparisons with a storage module (not shown) and issues the fault signal when at least one of the reference voltage signals deviates beyond the failure threshold value in some examples, or when all of the reference voltage signals deviate beyond the failure threshold value in other examples.

By averaging the two or more voltage references (e.g., 322, 324), the resulting accuracy is improved over that of the fault monitoring circuit 200. The effect of each reference is reduced by about half, as compared to the voltage variation discussed in reference to FIG. 2B. As shown in FIG. 3A, the averaged reference voltage (e.g., VREF 326) is checked against each reference. This will also flag a problem in the averaging circuit 320, or due to a downstream circuit corrupting the averaged reference signal.

Figure 3B:
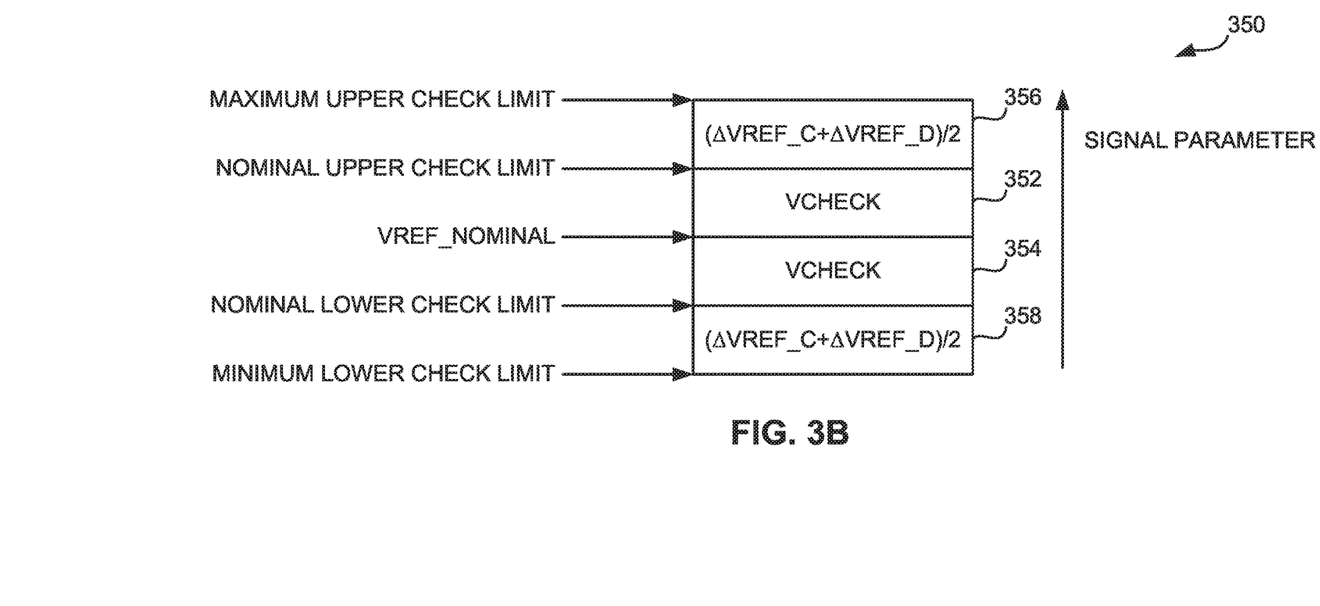
FIG. 3B illustrates a conceptual diagram of an example of an error voltage range for the fault monitoring circuit of FIG. 3A in accordance with one or more examples.

FIG. 3B illustrates a conceptual diagram of an example of an error budget 350 for the fault monitoring circuit of FIG. 3A. Not all of the depicted components may be used, however, and one or more examples may include additional components not shown in the figure. Variations in the arrangement and type of the components may be made without departing from the spirit or scope of the claims as set forth herein. Additional components, different components, or fewer components may be provided.

As illustrated in FIG. 3B, the failure threshold for the nominal upper limit is set to $(\Delta\text{VREF\_C}+\Delta\text{VREF\_D})/2$, where $\Delta\text{VREF\_C}$ is the variation of the primary voltage reference 322, and $\Delta\text{VREF\_D}$ is the variation of the secondary voltage reference 324. Similarly, the failure threshold for the nominal lower limit is set to $(\Delta\text{VREF\_C}-\Delta\text{VREF\_D})/2$. Each of the upper and lower check limits (or error check window), when defined according to these rules, is defined large enough to avoid any false faults. According to these requirements, the failure threshold (e.g., $V_{CHECK}$ as shown in 352 and 354) can be chosen to ensure no false faults, while having a value that is set to approximately half of the corresponding failure threshold value shown in FIG. 2B. In some examples, the failure threshold can be generated as a small fraction of the averaged reference voltage 326, so an error in either voltage reference potential has very little effect on the failure threshold (e.g., VCHECK).

In some examples, the failure threshold (i.e., VCHECK) can be set as a ratio of the averaged reference voltage 326 without compromising the accuracy of the monitoring circuit 310. In these examples, an error in one of the voltage references will have only a small effect on the failure threshold. For example, if the failure threshold (e.g., the amount a reference is allowed to deviate from the averaged reference) is nominally set to +/−0.5%, and one reference drifts by 1%, the failure threshold is only off (e.g., miscalculated or estimated) by 0.5% of 0.5%. In this respect, the failure threshold ratio can be set to compensate for this (relatively small) effect.

In some examples, the averaging of voltages can be extended to three or more reference voltage potentials. If three or more reference quantities are included, a "voting scheme" can be implemented to identify which reference has faulted, and to react accordingly (e.g., disable the faulting reference and notify the user). For example, if only one of the voltage reference potentials declares a fault, the faulting reference can be disconnected to keep the overall system online. The faulting reference may be disconnected only if the other two voltage reference potentials are not triggering a fault when three reference voltage potentials are implemented.

In some examples, other techniques for monitoring can be used, such as sampling with an analog-to-digital converter (ADC) and calculating an average and checking digitally by averaging multiple ADC conversions with different ADC reference potentials, and averaging and comparing the results. In some examples, a primary voltage reference is applied to the reference input of the ADC, and the ADC is used periodically to measure a secondary voltage reference. When the secondary voltage reference is measured, the error from the expected value can be calculated digitally, and (if the error is within acceptable range) other quantities measured by the ADC can be digitally adjusted by half of the measured reference error. If the reference error is outside an acceptable range, a fault can be declared or system operation can be disabled or modified accordingly.

Figure 4:
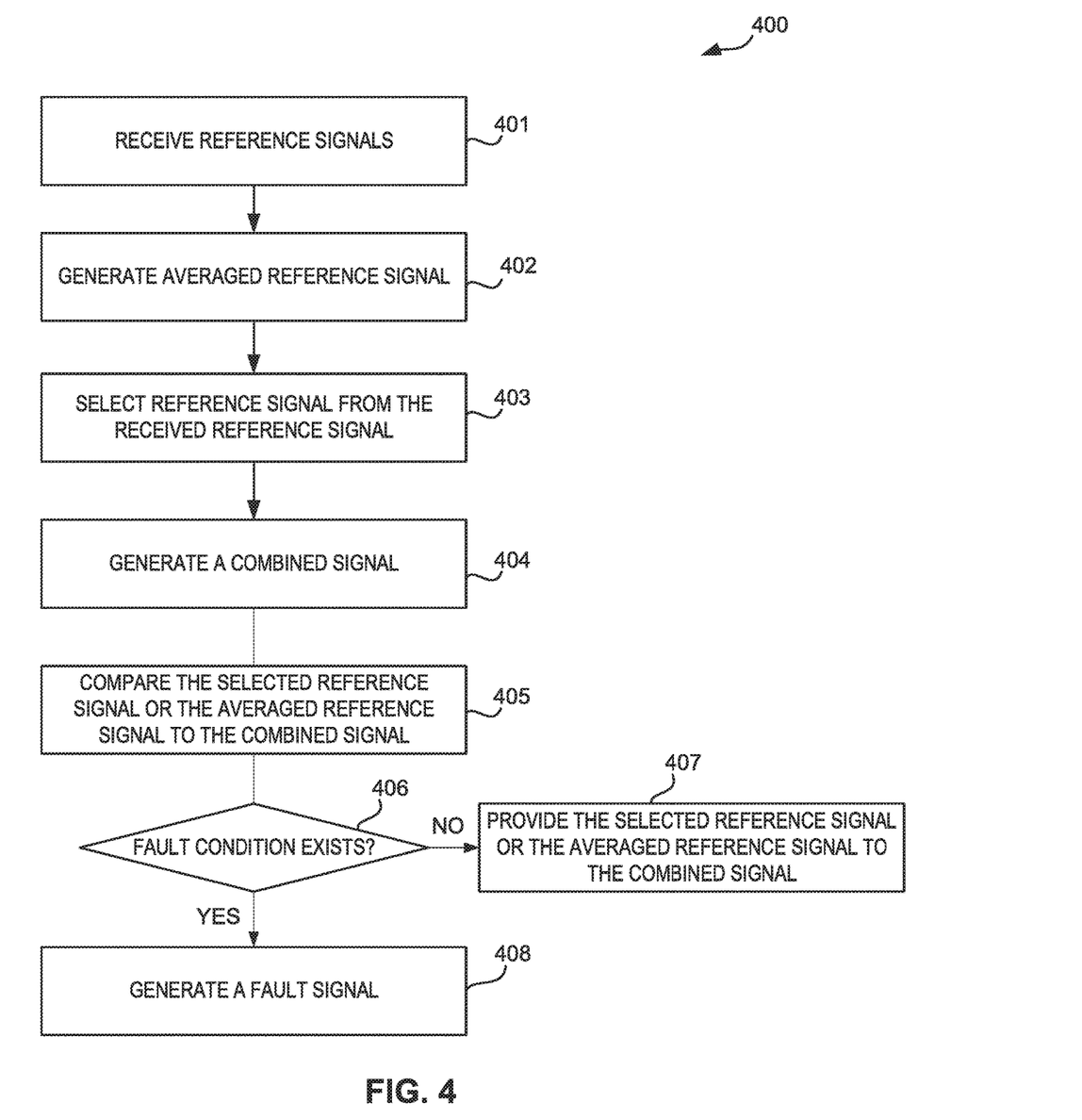
FIG. 4 illustrates a flowchart of an example process for fault monitoring an averaged reference in accordance with one or more examples of the subject technology.

FIG. 4 illustrates a flowchart of an example sequential process 400 for fault monitoring an averaged reference in accordance with one or more examples of the subject technology. Further for explanatory purposes, the blocks of the sequential process 400 are described herein as occurring in serial, or linearly. However, multiple blocks of the process 400 may occur in parallel. In addition, the blocks of the process 400 need not be performed in the order shown and/or one or more of the blocks of the process 400 need not be performed.

The process 400 begins at operation 401, in which the fault monitoring circuit 300 can receive or generate a set of two or more reference signals. The reference signals can be received from, or generated by, substantially independent circuits, such as independent voltage supplies, current sources, or signal generators. At operation 402, the fault monitoring circuit 300 can average two or more of the set of reference signals to produce an averaged reference signal, such as by using the averaging circuit 320. At operation 403, the fault monitoring circuit 300 can select a reference signal from one of the set of reference signals, such as through the operation of a control circuit. At operation 404, the fault monitoring circuit 300 can combine the selected reference signal or the averaged reference signal with an error check signal to produce a combined signal. In an example, the fault monitoring circuit 300 can combine VREF_C (FIG. 3A) with the error check signal in one step, combine VREF_D (FIG. 3A) with the error check signal in another step, or combine the averaged reference voltage to the error check signal in still another step. At operation 405, the fault monitoring circuit 300 can compare the selected reference signal or the averaged reference signal to the combined signal. At operation 406, the fault monitoring circuit 300 can determine whether a fault condition exists based on the comparison. In some examples, the fault condition can indicate that the selected reference signal or the averaged reference signal exceeds the combined signal by at least a failure threshold value. At operation 407, the fault monitoring circuit 300 can provide the averaged reference signal (or the selected reference) as a system reference voltage to a load when a fault condition does not exist. At operation 408, the fault monitoring circuit 300 can generate a fault signal when a fault condition exists.

The following examples define various examples of the present disclosure.

Example 1 is a circuit to monitor a reference signal, the circuit comprising a monitor circuit; and an averaging circuit configured to: receive two or more reference signals, and generate a combined reference signal, the combined reference signal comprising a variance that is smaller than a combined variance of the two or more reference signals; wherein the monitor circuit is configured to: compare the combined reference signal and at least one reference signal of the two or more reference signals, and generate, in response to an indication that the comparison violates a specified criterion, a fault signal.

In Example 2, the subject matter of Example 1 is optionally configured to include an error circuit configured to adjust, prior to the determining, the combined reference signal or the at least one reference signal by an indicated signal tolerance.

In Example 3, the subject matter of Example 1 is optionally configured to include a control circuit to toggle a selection of the at least one reference signal between the first reference signal of the two or more reference signals and a second reference signal of the two or more reference signals.

In Example 4, the subject matter of Example 1 is optionally configured to include a resistor network configured to generate the combined reference signal.

In Example 5, the subject matter of Example 1 is optionally configured such that the combined reference signal comprises an average of the two or more reference signals.

In Example 6, the subject matter of Example 1 is optionally configured such that each of the two or more reference signals comprise a voltage reference.

In Example 7, the subject matter of Example 1 is optionally configured such that the specified criterion comprises a threshold value for a difference between the combined reference signal and the at least one reference signal, the threshold value being derived using a ratio of the combined reference signal to the at least one reference signal of the two or more reference signals.

Example 8 is a system to detect a fault in a reference signal, the system comprising: an averaging circuit configured to receive two or more reference signals and to generate a combined signal using the two or more reference signals, the combined signal having a variance that smaller than a total variance of the two or more reference signals; a switch circuit to select a reference signal from the two or more reference signals; an error check circuit configured to generate an error check signal; and a comparator circuit configured to: compare the combined signal to the selected reference signal using the error check signal; and generate a fault signal when the combined signal deviates from the selected reference signal by at least a threshold value.

In Example 9, the subject matter of Example 8 is optionally configured such that the combined signal comprises an average of the two or more reference signals.

In Example 10, the subject matter of Example 8 is optionally configured such that the error check circuit is configured to generate the error check signal based on an indicated system tolerance to errors in the two or more reference signals.

In Example 11, the subject matter of Example 8 is optionally configured such that the averaging circuit comprises a resistor network configured to generate the combined signal.

In Example 12, the subject matter of Example 8 is optionally configured such that each of the two or more reference signals comprise a voltage reference.

In Example 13, the subject matter of Example 8 is optionally configured such that the threshold value comprises a fractional value of the combined signal.

In Example 14, the subject matter of Example 8 is optionally configured such that the threshold value comprises a ratio of the combined reference signal to at least one reference signal of the two or more reference signals.

Example 15 is a method of monitoring a reference signal, the method comprising: receiving two or more reference signals; generating an averaged reference signal using the two or more reference signals; selecting a reference signal from the two or more reference signals; generating a combined signal by adjusting the averaged reference signal or the selected reference signal using an error check signal to; comparing the selected reference signal or the averaged reference signal to the combined signal; determining, based on the comparison, whether a fault condition exists, and generating a fault signal when the fault condition exists.

In Example 16, the subject matter of Example 15 is optionally configured such that determining whether a fault condition exists comprises: determining whether the selected reference signal or the averaged reference signal deviates from the combined signal by at least a failure threshold value.

In Example 17, the subject matter of Example 15 is optionally configured such that adjusting the averaged reference signal or the selected reference signal using the error check signal comprises combining the averaged reference signal or the selected reference signal with the error check signal.

In Example 18, the subject matter of Example 15 is optionally configured to provide the averaged reference signal or the selected reference signal to a load when a fault condition does not exist.

In Example 19, the subject matter of Example 15 is optionally configured such that generating the averaged reference signal comprises using a resistor network to average the two or more reference signals.

In Example 20, the subject matter of Example 15 is optionally configured such that determining the error check signal is based on an indicated tolerance to errors in the selected signal.

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the inventive subject matter may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "Wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer-readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the inventive subject matter should be determined with reference to the appended claims, along with the full scope of equivalents to which such claims are entitled.

What is claimed is:

1. A circuit to monitor a reference signal, the circuit comprising:
    an averaging circuit to generate a combined reference signal using two or more reference signals, the combined reference signal comprising a variance that is smaller than a combined variance of the two or more reference signals;
    a monitor circuit comprising:
        a comparator circuit, coupled to the averaging circuit, to compare the combined reference signal and at least one reference signal of the two or more reference signals, and
        a generator circuit to generate, responsive to an indication that a result of the comparison violates a specified criterion, a fault signal;
    an error circuit to generate an offset signal; and
    a switching circuit, coupled to the averaging circuit and to the at least one reference signal, to selectively adjust, prior to the comparing, the combined reference signal and the at least one reference signal using the offset signal.

2. The circuit of claim 1, wherein:
    in a first configuration of the switching circuit, to selectively adjust the combined reference signal and the at least one reference signal using the offset signal, the switching circuit is to adjust the combined reference signal using the offset signal to generate an adjusted combined reference signal and the comparator circuit is configured to compare the adjusted combined reference signal to the at least one reference signal; and
    in a second configuration of the switching circuit, to selectively adjust the combined reference signal and the at least one reference signal using the offset signal, the switching circuit is to adjust the at least one reference signal using the offset signal to generate an adjusted reference signal and the comparator circuit is configured to compare the adjusted reference signal to the combined reference signal.

3. The circuit of claim 1, further comprising a control circuit to toggle a selection of the at least one reference signal between the first reference signal of the two or more reference signals and a second reference signal of the two or more reference signals.

4. The circuit of claim 1; further comprising a resistor network configured to generate the combined reference signal.

5. The circuit of claim 1, wherein the combined reference signal comprises an average of the two or more reference signals.

6. The circuit of claim 1, wherein each of the two or more reference signals comprise a voltage reference.

7. The circuit of claim 1; wherein the specified criterion comprises a threshold value for a signal difference between the combined reference signal and the at least one reference signal, the threshold value being derived using a ratio of the combined reference signal to the at least one reference signal of the two or more reference signals.

8. A system to detect a fault in a reference signal, the system comprising:
    an averaging circuit configured to receive two or more of reference signals and to generate a combined signal using the two or more reference signals; the combined signal having a variance that is smaller than a total variance of the two or more reference signals;
    a switch circuit to select a reference signal from the two or more reference signals;
    an error check circuit to generate an error check signal; and
    a comparator circuit coupled to the switch circuit and the error check circuit to:
    compare the combined signal to the selected reference signal using the error check signal; and generate a fault signal responsive to the combined signal deviating from the selected reference signal by at least a threshold value.

9. The system of claim 8, wherein the combined signal comprises an average of the two or more reference signals.

10. The system of claim 8, wherein the error check circuit is to generate the error check signal based on an indicated system tolerance to errors in the two or more reference signals.

11. The system of claim 8, wherein the averaging circuit comprises a resistor network configured to generate the combined signal.

12. The system of claim 8, wherein each of the two or more reference signals comprises a voltage reference.

13. The system of claim 8, wherein the threshold value comprises a fractional value of the combined signal.

14. The system of claim 8, wherein the threshold value comprises a ratio of the combined reference signal to at least one reference signal of the two or more reference signals.

15. A method of monitoring a reference signal, the method comprising:
receiving two or more reference signals;
generating an averaged reference signal using the two or more reference signals;
selecting a reference signal from the two or more reference signals;
generating a combined signal by adjusting the averaged reference signal or the selected reference signal using an error check signal;
comparing the selected reference signal or the averaged reference signal to the combined signal;
determining, based on the comparison, whether a fault condition exists; and
generating a fault signal when the fault condition exists.

16. The method of claim 15, wherein determining whether a fault condition exists comprises determining whether the selected reference signal or the averaged reference signal deviates from the combined signal by at least a failure threshold value.

17. The method of claim 15, wherein adjusting the averaged reference signal or the selected reference signal using the error check signal comprises combining the averaged reference signal or the selected reference signal with the error check signal.

18. The method of claim 15, further comprising providing the averaged reference signal or the selected reference signal to a load when a fault condition does not exist.

19. The method of claim 15, wherein generating the averaged reference signal comprises using a resistor network to average the two or more reference signals.

20. The method of claim 15, further comprising determining the error check signal based on an indicated tolerance to errors in the selected signal.

\* \* \* \* \*